(12) United States Patent
Parulkar

(10) Patent No.: US 7,650,543 B2
(45) Date of Patent: Jan. 19, 2010

(54) PLESIOCHRONOUS RECEIVER PIN WITH SYNCHRONOUS MODE FOR TESTING ON ATE

(75) Inventor: Ishwardutt Parulkar, San Francisco, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 640 days.

(21) Appl. No.: 11/582,798

(22) Filed: Oct. 18, 2006

(65) Prior Publication Data

US 2008/0115020 A1    May 15, 2008

(51) Int. Cl.
*G01R 31/28* (2006.01)

(52) U.S. Cl. .......................................... 714/724; 714/30

(58) Field of Classification Search ............. 370/230.1, 370/539, 276, 506, 466; 709/201; 714/724, 714/30
See application file for complete search history.

(56) References Cited

U.S. PATENT DOCUMENTS

| | | | |
|---|---|---|---|
| 5,706,285 A * | 1/1998 | Saijonmaa et al. ....... | 370/230.1 |
| 5,940,456 A | 8/1999 | Chen | |
| 6,422,177 B1 | 7/2002 | Noguero | |
| 6,487,223 B1 * | 11/2002 | Tanonaka ................... | 370/539 |
| 6,493,320 B1 | 12/2002 | Schober | |
| 7,113,489 B2 * | 9/2006 | Lindsey et al. ............. | 370/276 |
| 7,117,241 B2 * | 10/2006 | Bloch et al. ................. | 709/201 |
| 7,292,608 B1 * | 11/2007 | Nowell et al. ............... | 370/506 |
| 7,551,642 B2 * | 6/2009 | Ito et al. ..................... | 370/466 |
| 2008/0010569 A1 * | 1/2008 | Whetsel ...................... | 714/724 |

* cited by examiner

*Primary Examiner*—David Ton
(74) *Attorney, Agent, or Firm*—Meyertons, Hood, Kivlin, Kowert & Goetzel, P.C.; Erik A. Heter

(57) ABSTRACT

A method and apparatus for conveying test stimulus data from an ATE system to an integrated circuit (IC) via a plesiochronous interconnect. The IC includes a core logic unit and a first receiver coupled to the core logic unit by a first data path. The first receiver includes an input having an interconnect coupled thereto. In a normal mode of operation, the first receiver is configured to receive data transmitted plesiochronously over the interconnect and to convey the data, via the first data path, to the core logic unit. The integrated circuit also includes a second data path coupled between the core logic unit and the interconnect. In a test mode, the core logic unit is configured to receive test stimulus data conveyed synchronously over the second data path, wherein the test stimulus data is received by the IC from the ATE via the interconnect.

20 Claims, 5 Drawing Sheets

PLESIOCHRONOUS RECEIVER PIN WITH SYNCHRONOUS MODE FOR TESTING ON ATE

BACKGROUND OF THE INVENTION

1. Field of the Invention

This invention is related to integrated circuits, and more particularly, to the testing of integrated circuits having I/O pins that support plesiochronous interconnect.

2. Description of the Related Art

Plesiochronous signaling is a form of high-speed signaling capable of enabling chip-to-chip communications having transfer rates of up to 10 Gbits/s over a single interconnection. As such, plesiochronous links are capable of significantly higher data transfer speeds than traditional synchronous links (synchronized to a global clock) or source synchronous links (synchronized by a clock transmitted concurrently with the data). Instead of relying on a separate clock signal, plesiochronous links utilize an embedded clock signal, which is recovered from transmitted data by a clock-and-data recovery (CDR) circuit.

Due to the obvious speed advantages of plesiochronous links, many systems now utilize integrated circuits (IC's) configured to communicate with each other in this manner. However, configuring the I/O pins of an integrated circuit package for plesiochronous communications may present a significant obstacle to performing manufacturing tests thereupon.

Manufacturing tests of integrated circuits on automated test equipment (ATE) requires the ATE to be able to drive chip stimulus on input pins with reference to a clock so that the test stimulus is deterministic in time with respect to the ATE. These test stimuli are generated by an ATE program and received by the chip under test to perform test functions on the logic inside the chip. However, receiver pins and circuitry configured for plesiochronous reception of signals do not satisfy the ATE requirement of relying on a reference clock to align the test stimulus. Furthermore, a typical ATE system is not capable of generating test stimulus with the plesiochronous protocol information for alignment embedded within. Even if an ATE system could generate such a test stimulus stream, there is still a problem of misalignment with the test response to this stimulus, which will be misaligned with reference to the ATE internal clock on which the stimulus is sent.

To work around this limitation, IC's configured to receive data plesiochronously may include dedicated test pins that can synchronously receive test vectors or other stimulus from ATE. However, this solution is expensive, as it consumes silicon area on the die and pin count on the IC package. Furthermore, the number of dedicated test pins may be limited by other specifications of the IC. Limiting the number of dedicated test pins may in turn reduce the communications bandwidth between the IC and the ATE, increase the amount of time necessary to test the IC, or cause a reduction in the amount of testing that can be performed. Thus, for IC's configured to receive signals plesiochronously, testing may be significantly constrained.

SUMMARY OF THE INVENTION

A method and apparatus for conveying test stimulus data from an ATE to an integrated circuits (IC) via a plesiochronous pin and interconnect is disclosed. In one embodiment, the IC includes a core logic unit and a first receiver coupled to the core logic unit by a first data path. The first receiver includes an input having an interconnect coupled thereto. In a normal mode of operation, the first receiver is configured to receive data transmitted plesiochronously over the interconnect and to convey the data, via the first data path, to the core logic unit. The integrated circuit also includes a second data path coupled between the core logic unit and the interconnect. In a test mode, the core logic unit is configured to receive test stimulus data conveyed synchronously over the second data path, wherein the test stimulus data is received by the IC from the ATE via the interconnect.

In one embodiment, the method includes operating in a normal mode, wherein data is received plesiochronously via the interconnect. The data is initially received by a receiver having an input coupled to the interconnect. After the data is received it is subsequently conveyed over a first data path to a core logic unit. The method further comprises operating in a test mode, wherein test stimulus data is synchronously conveyed to the core logic unit. The test stimulus data is received via the interconnect from ATE, and is conveyed to the core logic unit over a second data path coupled between the interconnect and the core logic unit.

The interconnect may provide a path for conveying test stimulus data from the ATE to the IC for either a differential channel or two single-ended channels. In the differential channel embodiments, the second data path may be coupled between the core logic unit and the transmitter, with a selector circuit selecting the second data path when in the test mode.

In embodiments configured with two single-ended channels, second and third receivers and a third data path may also be present. Test stimulus data may be conveyed from the ATE to the core logic unit via a first pin connection of the interconnect and the second data path. Test stimulus data may also be conveyed from the ATE to the core logic unit via a second pin connection of the interconnect and a third data path. Since the embodiment utilizes two single-ended channels, test stimulus data may be conveyed over the first pin connection and the second data path independently of test stimulus data conveyed over the second pin connection and the third data path. In both the embodiments having a differential channel or two single-ended channels, test stimulus data is received and conveyed to the core logic unit synchronous with a clock signal.

Thus, the method and apparatus disclosed herein enables the dual use of the pins of a plesiochronous interconnect for plesiochronous data reception in a normal mode and for synchronous reception of test stimulus data from ATE in a test mode. This dual use of the pins that are normally used for plesiochronous data reception may eliminate the need to add dedicated test pins for transferring test stimulus data from ATE.

BRIEF DESCRIPTION OF THE DRAWINGS

Other aspects of the invention will become apparent upon reading the following detailed description and upon reference to the accompanying drawings in which.

Other aspects of the invention will become apparent upon reading the following detailed description and upon reference to the accompanying drawings in which.

Figure 1:
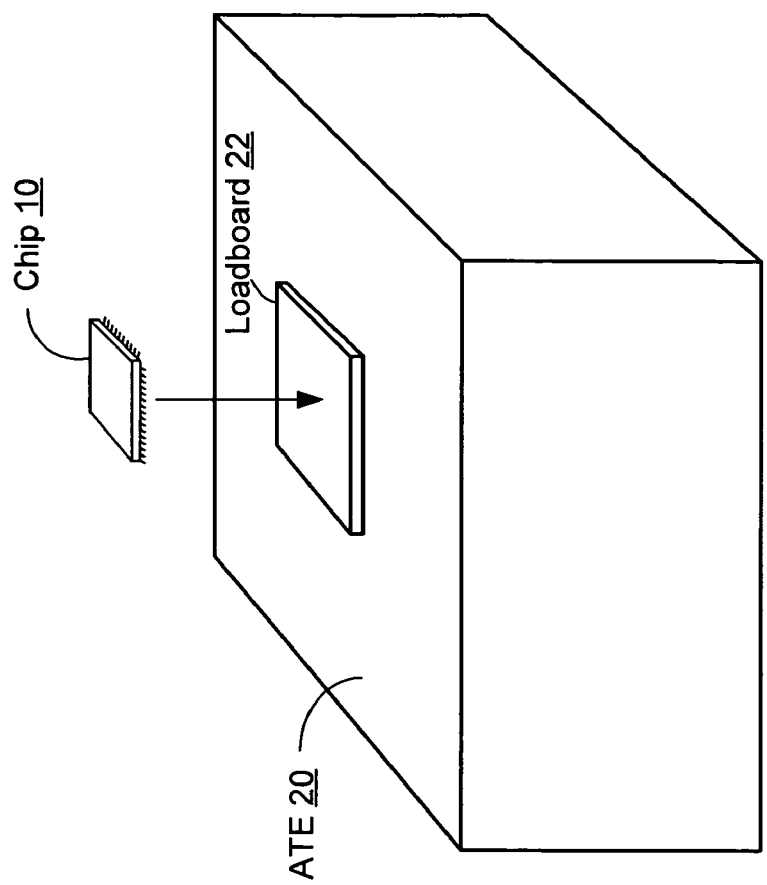
FIG. 1 is a drawing of one embodiment of an ATE (automated test equipment) system configured for testing integrated circuits (IC's)

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling with the spirit and scope of the present invention as defined by the appended claims.

DETAILED DESCRIPTION OF THE INVENTION

FIG. 1 is a drawing of one embodiment of an ATE (automated test equipment) system configured for testing integrated circuits (IC's). In the embodiment shown, automated test equipment (ATE) 20 is a test system configured for testing integrated circuits, such as chip 10. ATE 20 includes a loadboard 22 configured for coupling chip 10 to ATE 20. Loadboard 22 is configured to provide electrical connections between ATE 20 and chip 10, and may provide any electrical loading or termination necessary to ensure the integrity of signals transferred therebetween. ATE 20 is configured to provide test signals and stimulus to chip 10, and is further configured to receive and analyze test response signals and data received from chip 10.

Chip 10 is an integrated circuit package having one or more die, packaging, and pin connections. The package and pin connections may comprise a ball grid array, pin grid array, quad flat pack, or any other type of packaging/pin connection arrangement that may be suitable for the integrated circuit die packaged therein. Chip 10 may comprise virtually any type of integrated circuit, such as a microprocessor, a digital signal processing chip, an application specific integrated circuit (ASIC) or other type. ATE 20 is configured to test the functionality of chip 10, its electrical characteristics, or both.

Figure 2:
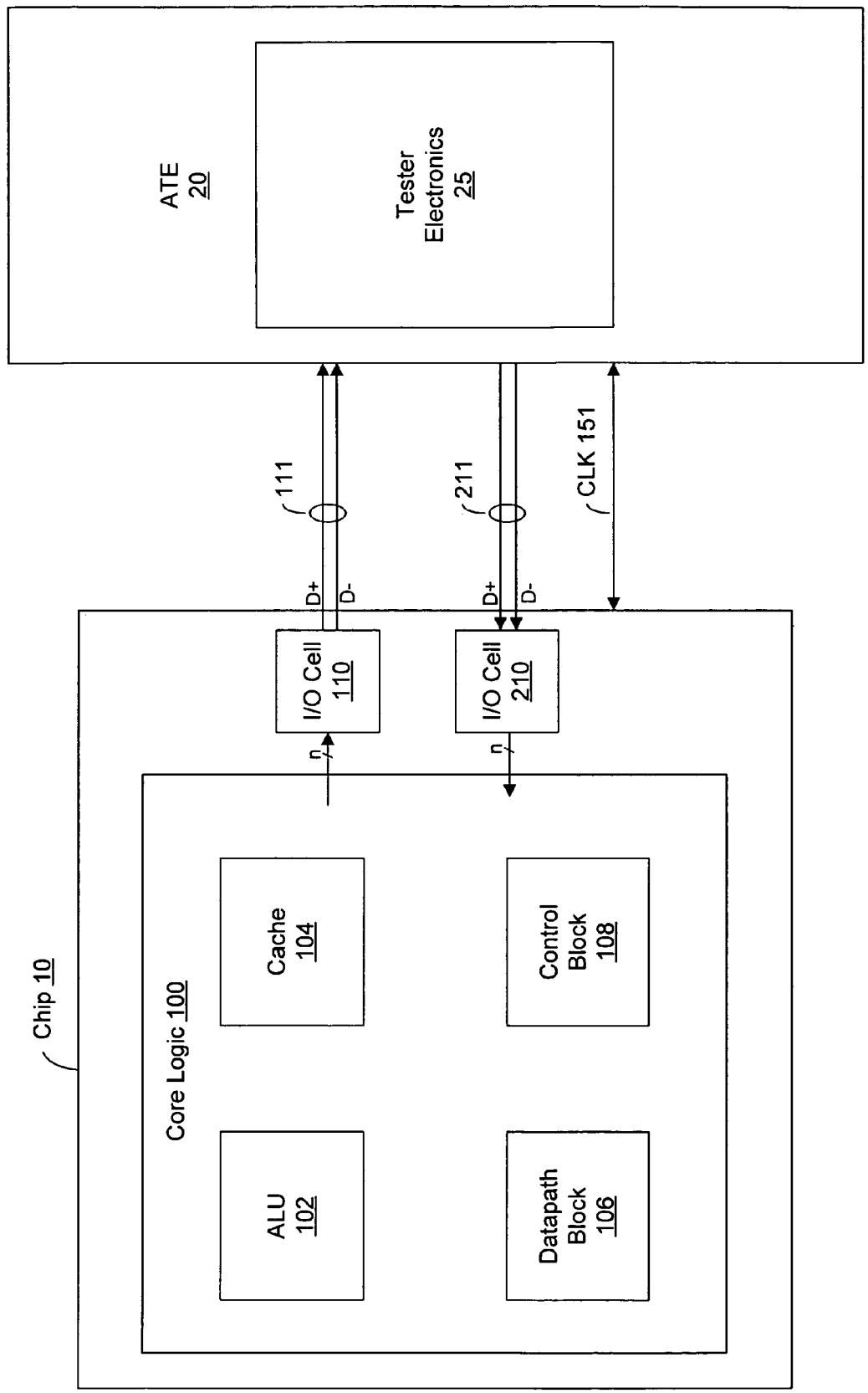
FIG. 2 is a block diagram of one embodiment of an ATE system coupled to an IC configured for being tested thereupon.

FIG. 2 is a block diagram of one embodiment of an ATE system coupled to an IC configured for being tested thereupon. In the embodiment shown, chip 10 and ATE 20 are coupled by a plurality of interconnections. The interconnections in this example are differential interconnections, and thus chip 10 includes first and second pins for each. For the sake of simplicity, only two interconnections are shown in this example, although it is to be understood that the exact number of interconnections may be greater and is limited only by the specific configuration of ATE 20 and chip 10.

In the embodiment shown, ATE 20 may send test stimulus data to chip 10 through one or more interconnections 211. Each of interconnections 211 is a differential interconnection, and is thus configured to receive a true signal (D+) and a complementary signal (D−). The test stimulus data may be received serially by I/O cell 210, converted into parallel data, and conveyed to core logic 100. In a normal mode of operation (i.e. when chip 10 is operating in its target system), I/O cell 210 is configured to receive data transmitted plesiochronously. However, in a test mode (i.e. when being tested on ATE 20), chip 10 may synchronously receive test stimulus data from ATE 20. The test stimulus data may be synchronized to a clock signal conveyed from ATE 20 to chip 10 via clock interconnection 151.

ATE 20 may receive test response data from chip 10 via one or more interconnections 111. Each of interconnections 111 is a differential interconnection, and is thus configured to transmit a true signal (D+) and a complementary signal (D−). The test response data may be conveyed in parallel from core logic 100 to I/O cell 110 and then transmitted serially over interconnect 111. During a normal mode of operation (i.e. when chip 10 is operating in its target system) chip 10 is configured to transmit data plesiochronously from I/O cell 110 over interconnect 111. However, in a test mode (i.e. when being tested on ATE 20), chip 10 may synchronously transmit test response data from to ATE 20. The test response data may be synchronized to a clock signal conveyed from core logic 100 of chip 10 to ATE via clock interconnection 150.

Chip 10 includes various type of functionality that may be tested by ATE 20. In this particular example, core logic 100 of chip 10 includes arithmetic logic unit 102, cache 104, datapath block 106, and control 108. Other or different types of functionality may be included, and the types of functionality shown in this example are not intended to be limiting.

Figure 3:
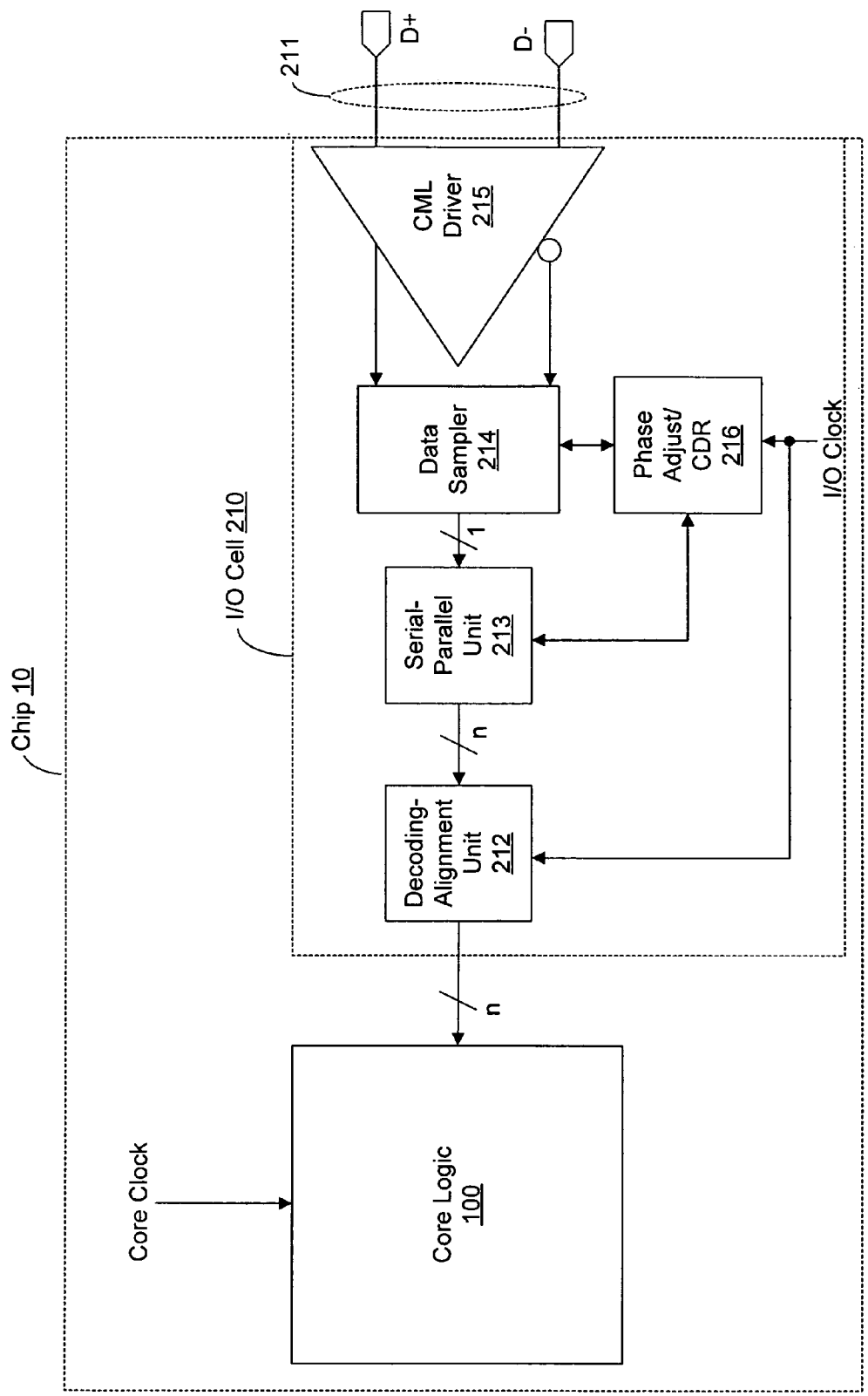
FIG. 3 is a block diagram of one embodiment of a receiver path between core logic of an IC and a plesiochronous receiver.

FIG. 3 is a block diagram of one embodiment of a receiver path between core logic of an IC and a plesiochronous receiver. In the embodiment shown, chip 10 includes an I/O cell 210 coupled to core logic 100. I/O cell 210 may be one of a plurality of I/O cells configured for receiving data transmitted plesiochronously. Only one instance of an I/O cell 210 is shown here, although it is understood that multiple instances may be present.

I/O cell 210 is configured to receive data transmitted plesiochronously over interconnect 211 when chip 10 is operating in a normal mode. Data is initially received by CML (common mode logic) driver 215, which receives both the true and complementary values of a differential signal. Received data is conveyed from CML driver 215 to data sampler 215. Data sampler 214 is configured to convert the differential data into single ended data.

Data is conveyed from data sampler 214 to both phase adjust/CDR (clock and data recovery) circuit 216 and serial-parallel unit 213. Phase adjust/CDR circuit 216 is configured to provide phase adjustment by performing phase interpolations for either a PLL or DLL in a clock and data recovery circuit. Phase adjust/CDR circuit 216 is also configured to recover a clock signal embedded in the received plesiochronous signal. The recovered clock signal may is provided to serial-parallel unit 213, where it provides synchronization in converting the received data from a serial data stream into parallel data. The parallel data is conveyed from serial-parallel unit 213 over a data path n bits wide (wherein n can be 8 bits, 16 bits, or any other suitable width) to decoding-alignment unit 212. Decoding-alignment unit aligns the data into units (e.g., into a packet) and also provides buffering for data prior to it being received by core logic 100, which is configured to receive data via an n-bit data path.

Figure 4:
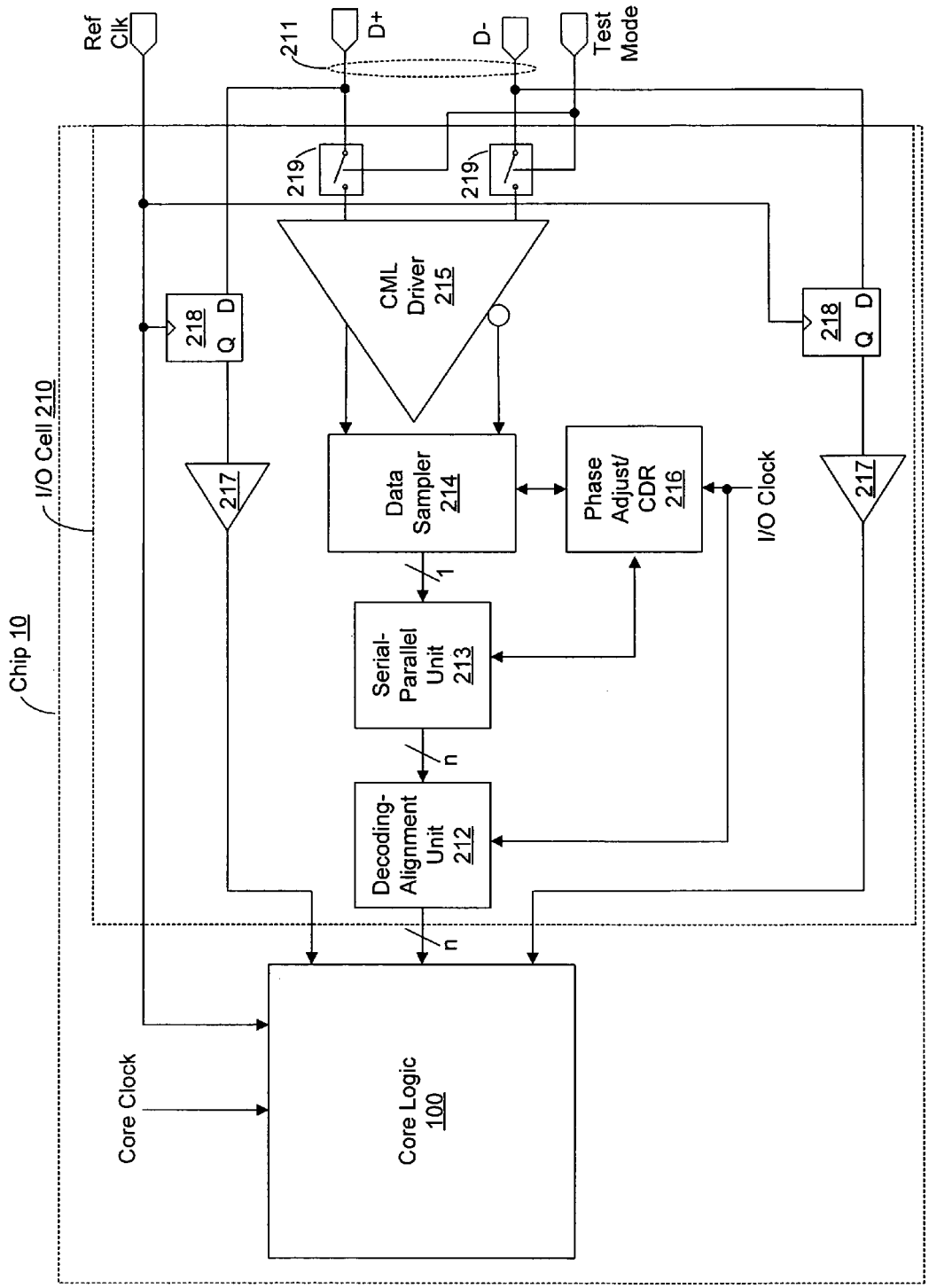
FIG. 4 is a block diagram of one embodiment of a plesiochronous receive path extending from a plesiochronous receiver to core logic further including a pair of alternate paths for synchronously receiving test stimulus from ATE over two single-ended channels.
Figure 5:
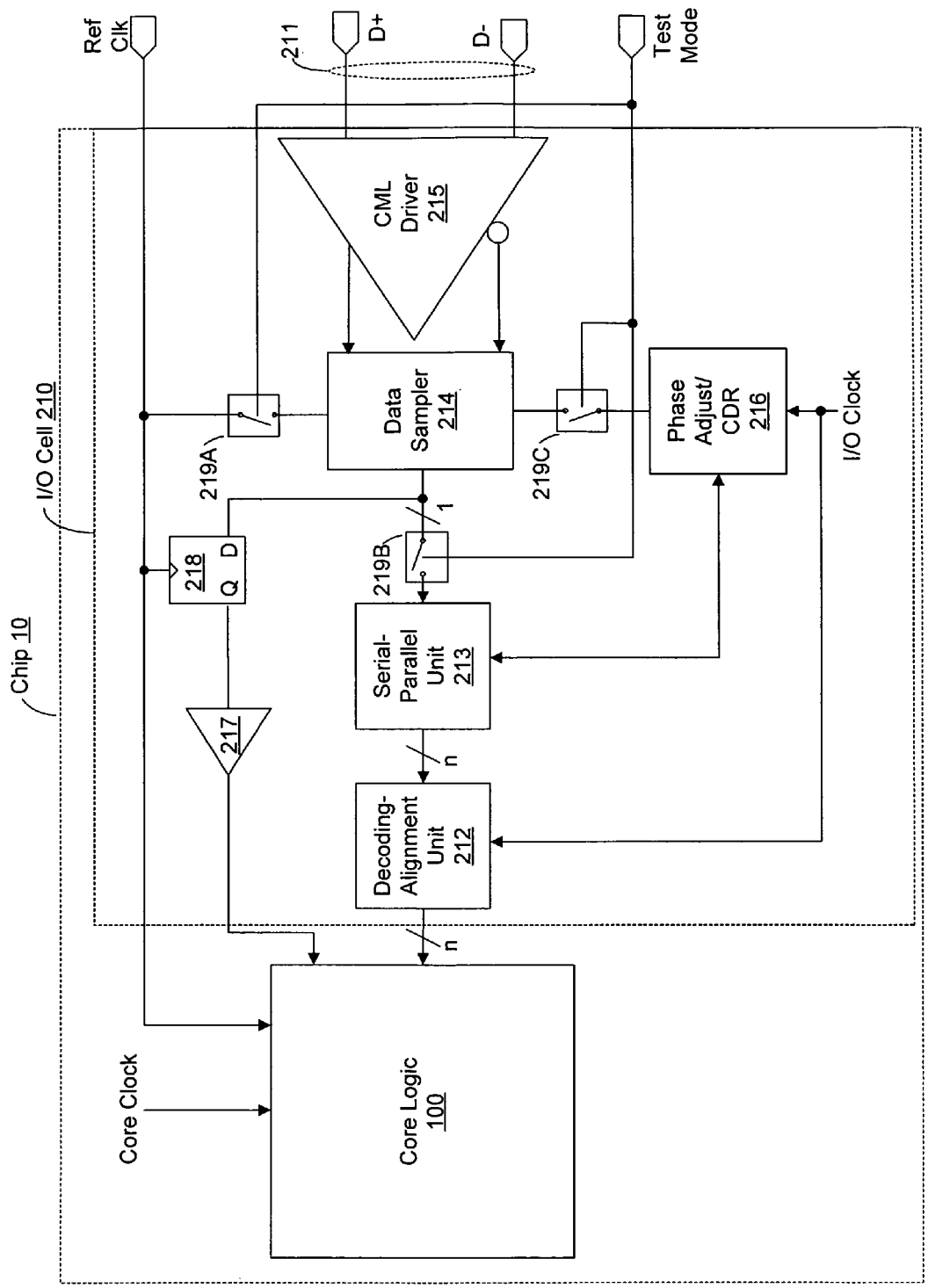
FIG. 5 is a block diagram of one embodiment of a plesiochronous receive path extending from a plesiochronous receiver to core logic including an alternate path for synchronously receiving data from ATE over a differential channel.

The data path shown in FIG. 3 is used for receiving data plesiochronously during normal operation. However, ATE systems such as that shown in FIGS. 1 and 2 are typically not configured to transmit data plesiochronously. Thus, in testing a chip such as chip 10, there must be provided an alternate path for conveying stimulus data from the ATE system to core logic 100 when operating in a test mode. FIGS. 4 and 5 illustrate alternate data paths for conveying test stimulus data from an ATE system to core logic 100 that utilize the same interconnect 211 that is used for plesiochronous data transmissions in a normal mode of operation.

FIG. 4 is a block diagram of one embodiment of a plesiochronous receive path extending from a plesiochronous receiver to core logic further including a pair of alternate paths for synchronously receiving test stimulus from ATE over two single-ended channels. In the embodiment shown, I/O cell is configured for operations in both a normal mode and a test mode. When operating the normal mode, the test mode signal is de-asserted, and switches 219 (which act as selector circuitry) are closed, thereby allowing signals received over interconnect 211 to be conveyed to the inputs of CML driver 215. In the normal mode, data is conveyed to core logic 100 as discussed above in reference to FIG. 3. Also, it is noted that, in the normal mode, no reference clock signal is received on the appropriately labeled signal input shown in the drawing and thus both flip-flops 218 remain idle.

In the test mode, the test mode signal is asserted, thereby causing switches 219 to be open, decoupling the CML drivers 215 from the chip pins. Furthermore, in the test mode, a reference clock signal is received from an ATE system, which is used to synchronize incoming test stimulus data that is to be provided to core logic 100.

The embodiment shown in FIG. 4 is configured to convey test stimulus data received from an ATE system to core logic 100 via two separate and independent single-ended channels. Core logic 100 is coupled to a first pin connection of interconnect 211 via test path 1 and a second pin connection via test path 2, which correspond to single-ended channels 1 and 2, respectively. Test stimulus data is serially conveyed through its respective channel to a flip-flop 218. Each bit of test stimulus data received is latched through a flip-flop 218 (with said latching synchronized to the reference clock signal received by chip 10 from the ATE system), and then driven over one of the test paths to core logic 100 by a single-ended driver circuit 217.

Thus, in the embodiment shown, an ATE system can transmit test stimulus data to core logic 100 through I/O cell 210 via two separate and independent channels, with each pin connection of the interconnect being associated with one of the two channels. In another embodiment, test stimulus data may be conveyed from an ATE system to core logic 100 through I/O cell 210 via a differential channel. This embodiment will now be discussed in further detail.

FIG. 5 is a block diagram of one embodiment of a plesiochronous receive path extending from a plesiochronous receiver to core logic including an alternate path for synchronously receiving data from ATE over a differential channel. In the configuration shown in FIG. 5, test stimulus data is received in differential form by CML driver 215, from which it is driven to data sampler 214. Differential data received by data sampler 214 is converted into single-ended data. When operating in the test mode (i.e. when the test mode signal is asserted), switch 219-A is closed, while switches 219-B and 219-C are open. Thus, the reference clock signal is received by data sampler 214, but no data is received by either of phase adjust/CDR circuit 216 or serial-parallel unit 213. Furthermore, test stimulus data can be latched through flip-flop 218 when operating in the test mode, since the reference clock signal is being provided. Thus, test stimulus data received by data sampler 214 and converted to single-ended data therein is then latched through flip-flop 218 and conveyed to core logic 100.

Thus, utilizing either of the embodiments shown in FIG. 4 or FIG. 5, an interconnect that is configured for receiving data plesiochronously in a normal mode of operation can also be used to receive test stimulus data from an ATE system when operating in a test mode. Since the same interconnect can be used in both the normal mode and the test mode, the addition of dedicated test pins (used only in a test mode but not during a normal mode) may be avoided.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. An integrated circuit comprising:
a core logic unit;
a first receiver coupled to the core logic unit;
an interconnect coupled to an input of the first receiver;
a first data path coupled between the receiver and the core logic unit, wherein, in a normal mode, the first receiver is configured to receive data transmitted plesiochronously over the interconnect and convey said data to the core logic unit via the first data path; and
a second data path, wherein, in a test mode, the core logic unit is configured to receive test stimulus data conveyed synchronously over the second data path, said test stimulus data being received via the interconnect from automated test equipment (ATE).

2. The integrated circuit as recited in claim 1, wherein the second path is coupled between the core logic unit and the first receiver.

3. The integrated circuit as recited in claim 2, wherein the first receiver is configured to receive differential signals from the interconnect, wherein the interconnect includes a first pin connection and a second pin connection.

4. The integrated circuit as recited in claim 3, wherein, in the test mode, the first receiver is configured to receive test stimulus data from the tester via the interconnection, wherein the interconnect includes a first pin connection and a second pin connection.

5. The integrated circuit as recited in claim 1, wherein the integrated circuit further comprises a second receiver coupled to the core logic unit by the second data path and a third receiver coupled to the core logic unit by a third data path.

6. The integrated circuit as recited in claim 5, wherein the interconnect includes a first pin connection and a second pin connection, and wherein, in the test mode, the second and third receivers are configured to received single-ended transmissions of test stimulus data via the first and second pin connections, respectively.

7. The integrated circuit as recited in claim 6, wherein the second and third data paths, the second and third receivers, and the first and second pin connections comprise first and second single-ended channels, respectively.

8. The integrated circuit as recited in claim 1, wherein the core logic unit is further configured to receive a clock signal, and wherein the integrated circuit further includes a clock interconnection enabling the clock signal to be conveyed to the core logic unit from the ATE.

9. The integrated circuit as recited in claim 8, wherein, in the test mode, test stimulus data received by the integrated circuit is synchronized to the clock signal, wherein the second data path includes a flip-flop coupled to receive the clock signal, and wherein the test stimulus data is latched through the flip-flop.

10. The integrated circuit as recited in claim 1, wherein the integrated circuit includes selector circuitry configured to select the first path in the normal mode and the second path in the test mode, wherein the selector circuitry is configured to receive a test mode signal from the ATE.

11. A method comprising:
in a normal mode, receiving data plesiochronously via an interconnect, wherein said data is received by a first receiver via the interconnect and subsequently conveyed over a first data path to a core logic unit; and
in a test mode, synchronously conveying test stimulus data to the core logic unit over a second data path, wherein said test stimulus data is received via the interconnect from automated test equipment (ATE).

12. The method as recited in claim 11, wherein the second path is coupled between the core logic unit and the first receiver.

13. The method as recited in claim 12, wherein the first receiver is configured to receive differential signals via the interconnect, wherein the interconnect includes a first pin connection and a second pin connection.

14. The method as recited in claim 13 further comprising the first receiver receiving test stimulus data from the ATE over a differential channel.

15. The method as recited in claim 11 further comprising a second receiver conveying test stimulus data to the core logic unit via the second data path and a third receiver conveying test stimulus data to the core logic unit via a third data path.

16. The method as recited in claim 15, wherein the interconnect includes a first pin connection and a second pin connection, and wherein, in the test mode, the second and third receivers are configured to receive single-ended transmissions of the test stimulus data from the ATE via the first and second pin connections, respectively.

17. The method as recited in claim 16, wherein the second and third data paths, the second and third receivers, and the first and second pin connections comprise first and second single-ended channels, respectively.

18. The method as recited in claim 11 further comprising the core logic unit receiving a clock signal from the ATE via a clock interconnection.

19. The method as recited in claim 18, wherein, in the test mode, test stimulus data transmitted from the ATE is synchronized to the clock signal, wherein the second data path includes a flip-flop coupled to receive the clock signal, and wherein the test stimulus data is latched through the flip-flop.

20. The method as recited in claim 11, wherein the integrated circuit includes selector circuitry configured to select the first path in the normal mode and the second path in the test mode, wherein the selector circuitry is configured to receive a test mode signal from the ATE.

* * * * *

UNITED STATES PATENT AND TRADEMARK OFFICE
CERTIFICATE OF CORRECTION

PATENT NO. : 7,650,543 B2  
APPLICATION NO. : 11/582798  
DATED : January 19, 2010  
INVENTOR(S) : Ishwardutt Parulkar It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 733 days.

Signed and Sealed this

Twenty-third Day of November, 2010

David J. Kappos  
*Director of the United States Patent and Trademark Office*